United States Patent
Suehira (10) Patent No.: US 7,183,782 B2
(45) Date of Patent: Feb. 27, 2007

(54) STAGE FOR PLACING TARGET OBJECT

(75) Inventor: Nobuhito Suehira, Isehara (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/954,546

(22) Filed: Oct. 1, 2004

(65) Prior Publication Data
US 2005/0093534 A1   May 5, 2005

(30) Foreign Application Priority Data
Oct. 31, 2003  (JP) .............................. 2003-373525

(51) Int. Cl.
*G01R 31/26* (2006.01)
(52) U.S. Cl. .................................. 324/754
(58) Field of Classification Search ............ None
See application file for complete search history.

(56) References Cited

U.S. PATENT DOCUMENTS

| | | | |
|---|---|---|---|
| 5,266,889 A | 11/1993 | Harwood et al. | |
| 5,345,170 A | 9/1994 | Schwindt et al. | |
| 5,457,398 A * | 10/1995 | Schwindt et al. | 324/754 |
| 6,244,493 B1 * | 6/2001 | Shimazaki et al. | 29/743 |
| 6,270,621 B1 | 8/2001 | Tam et al. | 156/345 |
| 6,676,803 B2 * | 1/2004 | Kim | 156/345.47 |

FOREIGN PATENT DOCUMENTS

| | | |
|---|---|---|
| EP | 0 574 149 | 12/1993 |
| EP | 1 119 025 | 7/2001 |
| EP | 1 167 573 | 1/2002 |
| EP | 1528589 A2 * | 5/2005 |
| JP | 6-53293 | 2/1994 |
| JP | 11-233572 | 8/1999 |
| JP | 2001-176938 | 6/2001 |

* cited by examiner

Primary Examiner—Jermele Hollington
(74) Attorney, Agent, or Firm—Oblon, Spivak, McClelland, Maier & Neustadt, P.C.

(57) ABSTRACT

A stage for placing a target object thereon includes, on a side surface of a stage main body having an upper surface, a lower surface, and the side surface, a side surface protection cover layer. The side surface protection cover layer isolates at least part of the side surface of the stage main body from an ambient atmosphere of the stage main body. The stage main body further includes an upper electrode on its upper surface and a lower electrode on its lower surface. At least the surface of the side surface protection cover layer is conductive. The stage can further include a potential control mechanism and a guard potential setting mechanism.

12 Claims, 6 Drawing Sheets

STAGE FOR PLACING TARGET OBJECT

CROSS-REFERENCE TO RELATED APPLICATIONS

This application is based upon and claims the benefit of priority from prior Japanese Patent Application No. 2003-373525, filed Oct. 31, 2003, the entire contents of which are incorporated herein by reference.

BACKGROUND OF THE INVENTION

1. Field of the Invention

The present invention relates to a stage for placing a target object thereon when processing the target object. More specifically, the present invention relates to a stage having a side surface protection cover layer on the side surface of the stage. Still more specifically, the present invention relates to a stage having a side surface protection cover layer to set the potential of the stage to a guard potential.

2. Description of the Related Art

Figure 6A:
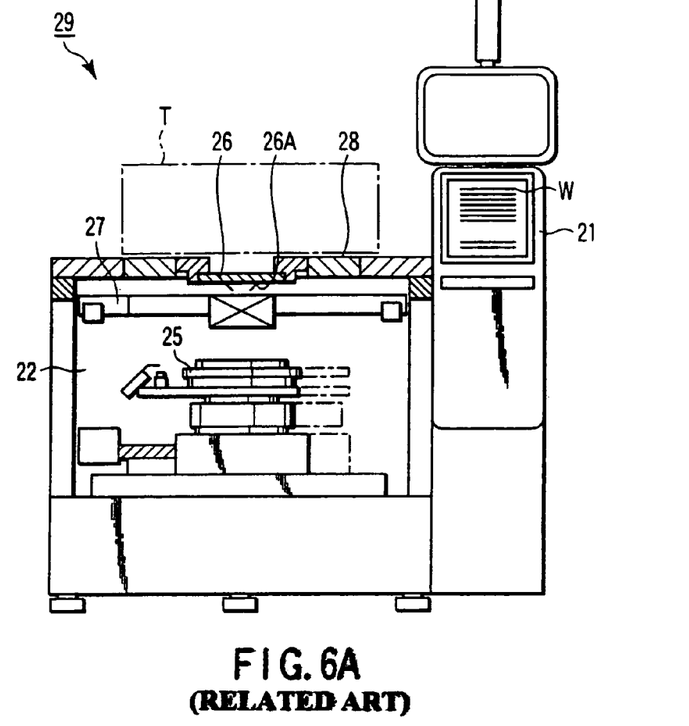
FIGS. 6A and 6B are views showing a conventional prober.
Figure 6B:
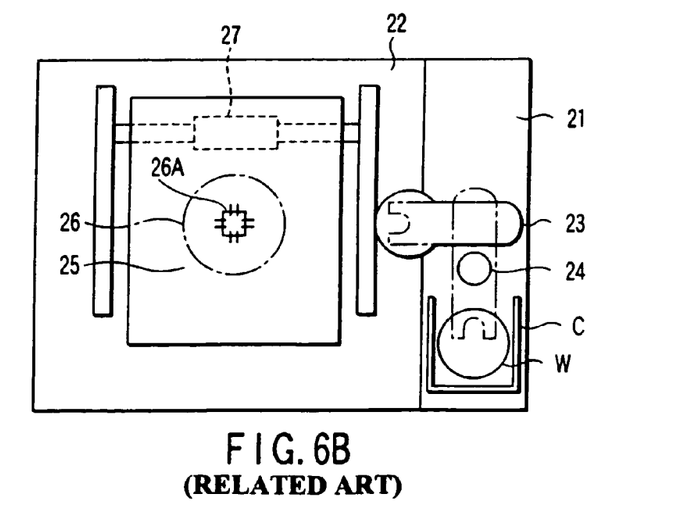

An example of a process of processing a target object is a semiconductor manufacturing process. The semiconductor manufacturing process includes a step of testing a plurality of semiconductor elements (to be referred to as "devices" hereinafter) formed on a wafer. FIGS. 6A and 6B show an example of a testing apparatus for practicing this testing process. A testing apparatus (e.g., a prober) 29 can include a loader chamber 21 and prober chamber 22. A cassette C storing a plurality of wafers W is arranged in the loader chamber 21. The wafers W are transported from the cassette C into the prober chamber 22 one by one. In the prober chamber 22, the electrical characteristics of the wafer W are tested.

As shown in FIGS. 6A and 6B, the loader chamber 21 can include a wafer transporting mechanism 23 and coarse positioning mechanism (to be referred to as "subchuck" hereinafter) 24. The wafer transporting mechanism 23 transports the wafers W one by one. The subchuck 24 aligns the direction of a wafer W to be transported by the wafer transporting mechanism 23.

The prober chamber 22 can include a stage 25, probe card 26, and positioning mechanism (to be referred to as "alignment mechanism" hereinafter) 27. The stage 25 moves in three-axis directions (X, Y, and Z directions) with the wafer W placed thereon, and rotates clockwise and counterclockwise in the θ directions. The probe card 26 is arranged above the stage 25. The alignment mechanism 27 aligns probes 26A of the probe card 26 and the wafer W on the stage 25 to each other.

The probe card 26 is fixed to the lower portion of a head plate 28 of the prober chamber 22. A test head T is arranged on the head plate 28. The test head T electrically connects the probe card 26 to a tester.

Assume that the electrical characteristics of devices formed on the wafer W are to be tested. The wafer transporting mechanism 23 extracts the wafer W from the cassette C, and places it on the stage 25 in the prober chamber 22. While the wafer transporting mechanism 23 transports the wafer W, the wafer W is aligned with a predetermined direction on the subchuck 24. In the prober chamber 22, the stage 25 is moved in the X, Y, and θ directions under alignment information from the alignment mechanism 27. Hence, the wafer W and probes 26A are aligned. The stage 25 moves in the X and Y directions to position the first device immediately under the probes 26A. After that, the stage 25 moves upward in a Z direction to bring the probes 26A into electrical contact with the electrodes of the device. The stage 25 is further overdriven, and the electrical characteristics of the device are tested. After the test, the stage 25 moves downward, and moves in the X and Y directions. By this movement, the wafer W is fed by index driving, and a device as the next testing target is arranged immediately below the probes. The stage 25 moves upward and is overdriven. The next device is tested in this state. The above steps are repeated so that the electrical characteristics of a plurality of devices formed on the wafer W can be tested.

After the test for the devices is ended, the wafer transporting mechanism 23 returns the wafer W to the initial position in the cassette C. The above operation is repeated to test the electrical characteristics of the devices formed on the next wafer W.

In a case wherein a small current flowing through a target object is to be measured by using a parametric tester or the like, a measurement accuracy of several pA or less is required. For this purpose, for example, the main body and tester may be connected through a triaxial cable or the like. A lower surface electrode or the like may be arranged on the lower portion of the stage, so that the potential of the lower portion becomes a guard potential.

By taking these measures, a current can be prevented from flowing from the frame ground (FG) or other potentials into the stage, or flowing out from the stage.

For example, in the next-generation semiconductor device, however, a current much smaller than the present current in a gate oxide film which is on the level of the tunnel current must be detected. Consequently, an influence caused by a small current due to the presence of dust or dirt and furthermore a humidity change, which are not presently considered as major problems become unignorable. When an ionic material such as dust or dirt attaches to the insulator of the stage main body, a voltage is generated by the same voltage generating principle as in a cell. This may be one of the reasons that generate the voltage. When the humidity increases, ion mobility increases, further promoting this phenomenon. Hence, the necessity of anti-dust or anti-dirt countermeasures is recognized.

Patent reference 1 discloses a probe station for performing low-current, low-voltage measurement of a wafer or other electronic test devices with a high accuracy. The probe station includes an environmental control surrounding body and peripheral conductive member. The environmental control surrounding body electromagnetically shields a chuck assembly. The peripheral conductive member is arranged around the chuck assembly element at a predetermined gap.

Patent reference 1 does not specifically explain the role of the peripheral conductive member. Still, the peripheral conducive member may be designed to serve as an electromagnetic shield, in the same manner as the environmental control surrounding body. The peripheral conductive member is arranged around the chuck assembly element at a predetermined gap from it. Therefore, although the peripheral conductive member can serve as the electromagnetic shield, it cannot block dust or dirt entering the gap from attaching to the side surface of the chuck assembly.

[Patent Reference 1]

Jpn. Pat. Appln. KOKAI Publication No. 6-53293

BRIEF SUMMARY OF THE INVENTION

It is an object of the present invention to solve at least one of the problems described in the background art described above.

According to the first aspect of the present invention, there is provided a stage for placing a target object thereon, comprising:

a stage main body having an upper surface, lower surface, and side surface, the main body being made of an electrical insulating material; and a side surface protection cover layer arranged on the side surface of the stage main body, the side surface protection cover layer serving to isolate at least part of the side surface of the stage main body from an ambient atmosphere of the main body.

According to the second aspect of the present invention, there is provided a stage for placing a target object thereon, comprising:

a stage main body having an upper surface, lower surface, and side surface, the main body being made of an electrical insulating material;

an upper electrode arranged on the upper surface of the stage main body;

a lower electrode arranged on the lower surface of the stage main body; and a side surface protection cover layer arranged on the side surface of the stage main body, the side surface protection cover layer serving to isolate at least part of the side surface of the stage main body from an ambient atmosphere of the main body.

The stage provided according to the second aspect preferably further comprises at least any one of the following items (a) to (k), or a combination of some of the following items (a) to (k).

(a) At least a surface of the side surface protection cover layer is conductive.
(b) A potential control mechanism to control a potential of the upper electrode.
(c) A guard potential setting mechanism which controls a potential of the conductive surface of the side surface protection cover layer and a potential of the lower electrode.
(d) The side surface protection cover layer has a plate-like structure, and is in tight contact with the side surface of the stage main body.
(e) The side surface protection cover layer has a structure with a U-shaped section.
(f) The side surface protection cover layer is formed by a plating process.
(g) The side surface protection cover layer having at least the conductive surface is made of a conductive plastic material.
(h) The side surface protection cover layer is separate from the upper electrode so as not to come into electrical contact with it.
(i) An insulating layer arranged between the stage main body and side surface protection cover layer.
(j) The side surface protection cover layer having the plate-like structure is detachably attached to the side surface of the stage main body.
(k) The side surface of the stage main body includes a dropping prevention mechanism which prevents the side surface protection cover layer from dropping.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Modes of Embodiments of the Invention

The present invention will be described in relation to, as a typical example, a stage for placing a semiconductor wafer thereon when the electrical characteristics of a semiconductor device formed on the semiconductor wafer are to be tested. Note that the present invention is not limited to the stage for placing a semiconductor wafer thereon.

The present invention can be employed in a stage for placing thereon any target object from which the influence of an unnecessary small current must be removed. The process for the target object is not limited to testing of electrical characteristics, but includes the manufacture of electric devices and electrical components, fine adjustment operation, and the like.

As an embodiment of the present invention, a stage that can be employed in a prober to test the electrical characteristics of a semiconductor device formed on a semiconductor wafer will be described.

Figure 1A:
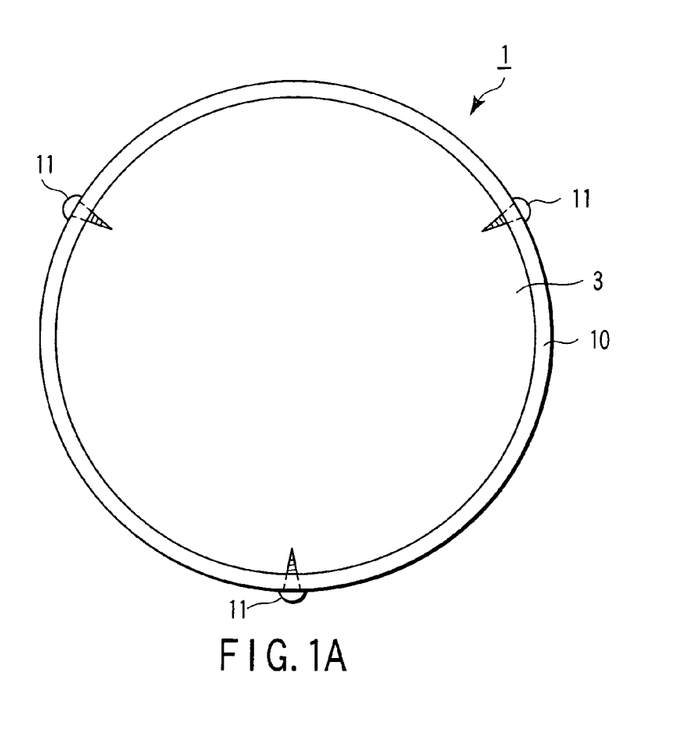
FIGS. 1A and 1B are views showing a stage having a plate-like side surface protection cover according to the first embodiment of the present invention.
Figure 1B:
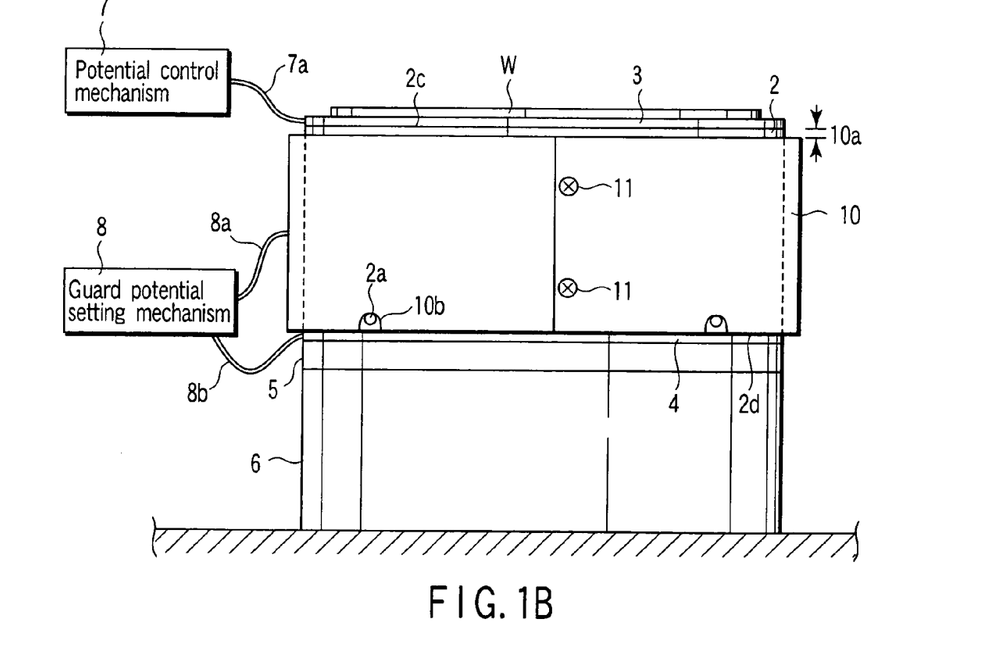

Referring to FIGS. 1A and 1B, a stage main body 2 can be a cylindrical body to match the shape of the semiconductor wafer. The stage main body 2 is not limited to a cylindrical body, but can employ any structure on which a target object can be placed appropriately.

An upper electrode 3 is preferably arranged on an upper surface 2c of the stage main body 2. A semiconductor wafer W is arranged on the upper electrode 3. The upper electrode 3 preferably includes a fixing mechanism to fix the placed semiconductor wafer. The fixing mechanism can fix the semiconductor wafer by using a vacuum force. A potential control mechanism 7 can serve to apply a potential necessary for processing or testing the semiconductor wafer W to the upper electrode 3 through a cable 7a, or to remove an unnecessary potential. The upper electrode 3 can apply a potential to the semiconductor wafer W when, e.g., measuring a capacitance C of the semiconductor wafer W.

If the role of the upper electrode 3 described above is not necessary, the upper electrode 3 is not employed. The upper electrode 3 can have a plate structure made of a conductive metal, e.g., nickel or copper. The upper electrode 3 can also be formed by plating the upper surface of the stage main body 2 with the conductive metal.

A lower electrode 4 can be arranged on a lower surface 2d of the stage main body 2. The lower electrode 4 can serve to set the potential of the lower portion of the stage main body 2 to be equal (guard potential) to that of a component in contact with or close to the stage main body 2.

The lower electrode 4 can have a plate structure made of a conductive metal, e.g., nickel or copper. The lower electrode 4 can also be formed by plating the upper surface of the stage main body 2 with the conductive metal.

The lower electrode 4 is preferably electrically connected to a guard potential setting mechanism 8 through a cable 8b. The lower electrode 4 sets the stage main body 2 at the guard potential. Then, the potential gradient between the stage main body 2 and the component disappears. Accordingly, the current can be prevented from flowing from the stage main body 2 to the component or vice versa.

The stage main body 2 can be arranged on a base 6. Furthermore, a temperature control mechanism 5 can be arranged under the stage main body 2. The temperature control mechanism 5 heats or cools the stage main body 2.

A side surface protection cover layer 10 is formed on the side surface of the stage main body 2. The side surface protection cover layer 10 isolates at least part of the side surface of the stage main body 2 from the ambient atmosphere of the main body 2. Consequently, an ionic material such as dust or soil is prevented from attaching to the side surface of the stage main body 2.

Furthermore, the surface of the side surface protection cover layer 10 is preferably conductive. The conductive side surface protection cover layer 10 is connected to the guard potential setting mechanism 8 through a cable 8a. When a potential is generated in the side surface protection cover layer 10 due to dust, dirt, humidity, or the like, the side surface protection cover layer 10 can be maintained at the guard potential. Consequently, no unnecessary current flows out from the stage main body 2. No unnecessary current flows into the stage main body 2 from a peripheral component.

The conductive side surface protection cover layer 10 and upper electrode 3 are preferably avoided from being electrically connected to each other. For this purpose, as shown in FIG. 1B, the position of the upper portion of the side surface protection cover layer 10 can be set below the upper surface of the stage main body 2 by a gap 10a. More specifically, the constant gap 10a can be formed between the position of the upper portion of the side surface protection cover layer 10 and the upper surface of the stage main body 2. The length of the gap 10a can be set to at least 1 mm to 2 mm.

Figure 2A:
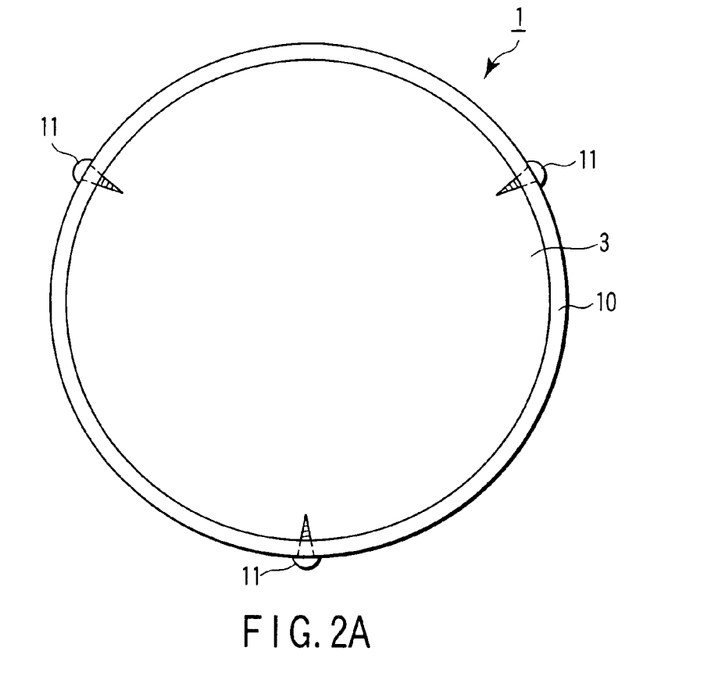
FIGS. 2A and 2B are views showing a stage having a plate-like side surface protection cover according to another embodiment of the present invention.
Figure 2B:
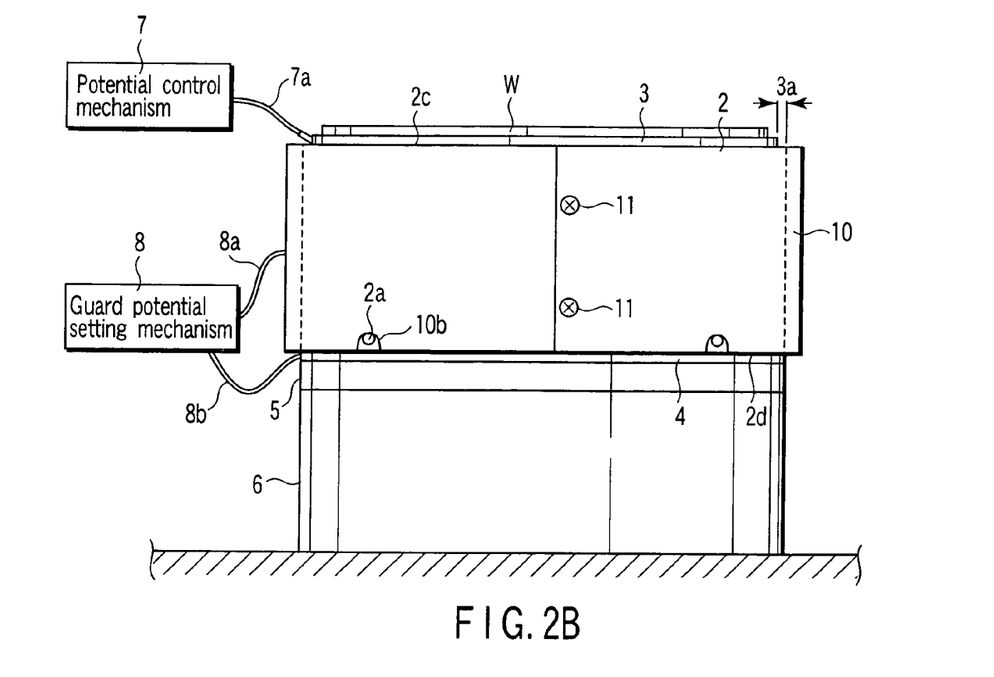

As shown in FIG. 2B, to avoid a conductive side surface protection cover layer 10 and upper electrode 3 from being electrically connected, the outer edge of the upper electrode 3 can be located inside the perimeter of a stage main body 2. More specifically, a gap 3a can be formed between the outer edge of the upper electrode 3 and the perimeter of the stage main body 2. The length of the gap 3a can be set to at least 1 mm to 2 mm.

Figure 3A:
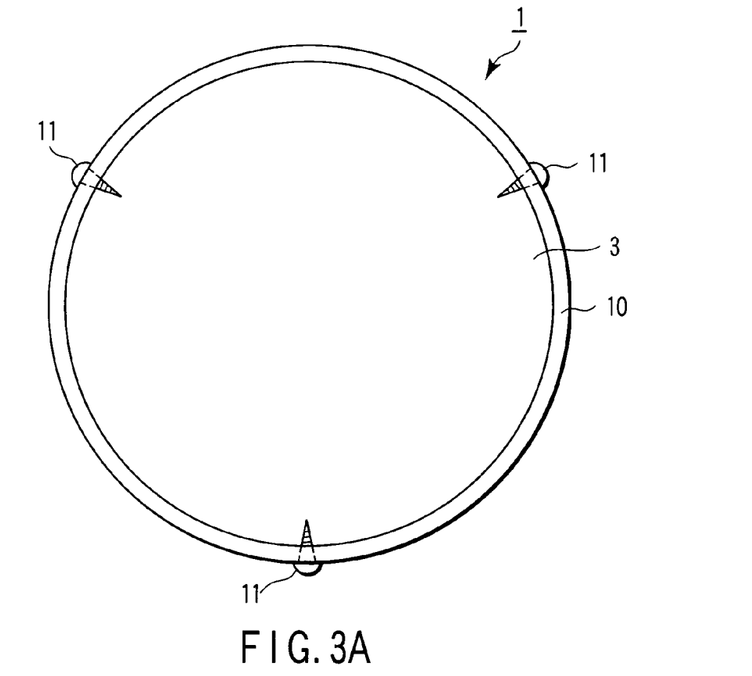
FIGS. 3A and 3B are views showing a stage having a side surface protection cover through an interposed insulating layer according to another embodiment of the present invention.
Figure 3B:
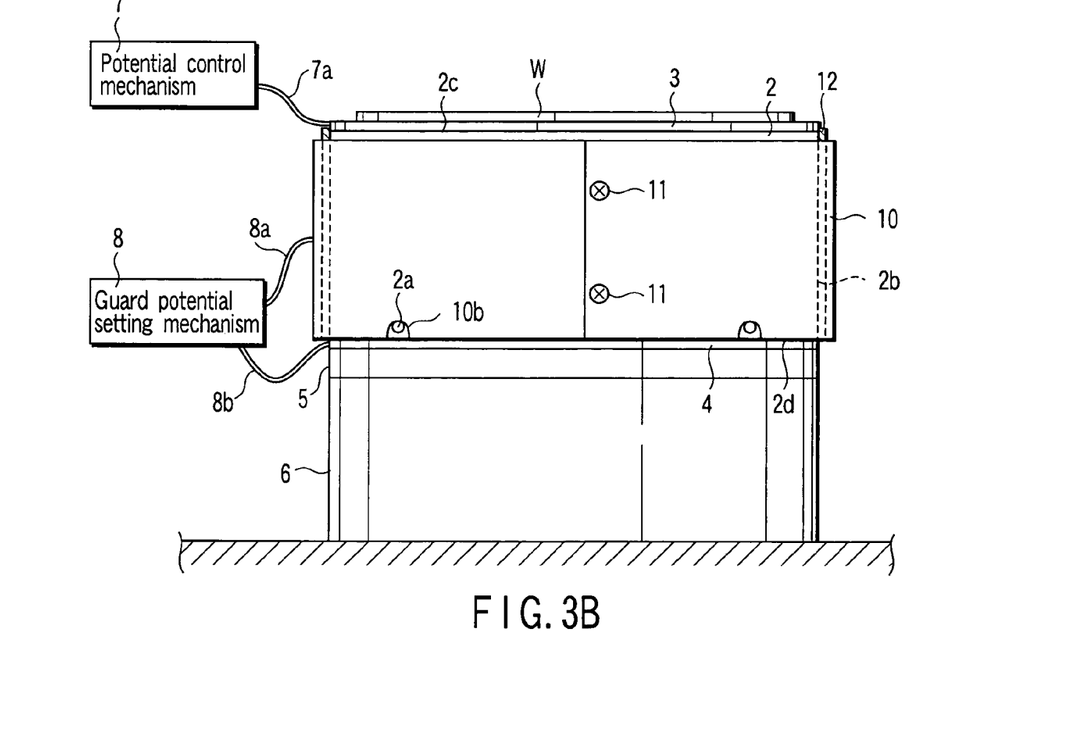

As shown in FIG. 3B, assume that the height of a conductive side surface protection cover layer 10 is to be set equal to that of the perimeter of a stage main body 2. In this case, an insulating layer 12 may be interposed between the side surface protection cover layer 10 and a side surface 2b of the stage main body 2. Then, electrical contact of the side surface protection cover layer 10 and side surface 2b can be prevented. The thickness of the insulating layer 12 is preferably at least 1 mm to 2 mm. The height of the insulating layer 12 may be larger, equal to, or smaller than that of the side surface protection cover layer 10. From the viewpoint of preventing electrical contact of the side surface protection cover layer 10 and side surface 2b, the height of the insulating layer 12 is preferably larger than that of the side surface protection cover layer 10.

As shown in FIG. 1B, the conductive side surface protection cover layer 10 can have a plate-like conductive metal plate structure. The plate-structure side surface protection cover layer 10 can be fixed to the stage main body 2 with fixing means (e.g., screws) 11, as shown in FIG. 1B. As shown in FIG. 1A, the plate-structure side surface protection cover layer 10 can be fixed to the stage main body 2 with the screws at a plurality of portions (e.g., three portions).

If the plate-structure side surface protection cover layer 10 is heavy, a dropping prevention mechanism is preferably provided. FIG. 1B shows hooks 2a and cutout catching portions 10b as an example of the dropping prevention mechanism. Each hook 2a projects from the side surface 2b of the stage main body 2. The cutout catching portions 10b are formed in the plate-like side surface protection cover layer 10. Assume that the plate-structure side surface protection cover layer 10 is to be attached to the stage main body 2. In this case, the cutout catching portions 10b of the plate-structure side surface protection cover layer 10 are engaged with the corresponding hooks 2a of the stage main body 2. With this engagement, the plate-structure side surface protection cover layer 10 can be attached to the side surface 2b of the stage main body 2 while it is prevented from dropping.

The plate-structure side surface protection cover layer 10 can be made of a metal material (e.g., nickel or gold).

Alternatively, the plate-structure side surface protection cover layer 10 can be made of a conductive plastic material. In this case, preferably, the outer surface of the plate-structure side surface protection cover layer 10 has a sufficiently large conductivity.

The plate-like side surface protection cover layer 10 can have such an attaching structure that it can be detached from the stage main body 2 by using means such as screws. When the detachable attaching structure is employed, the maintenance operation of the plate-structure side surface protection cover layer 10 can be facilitated.

Figure 4A:
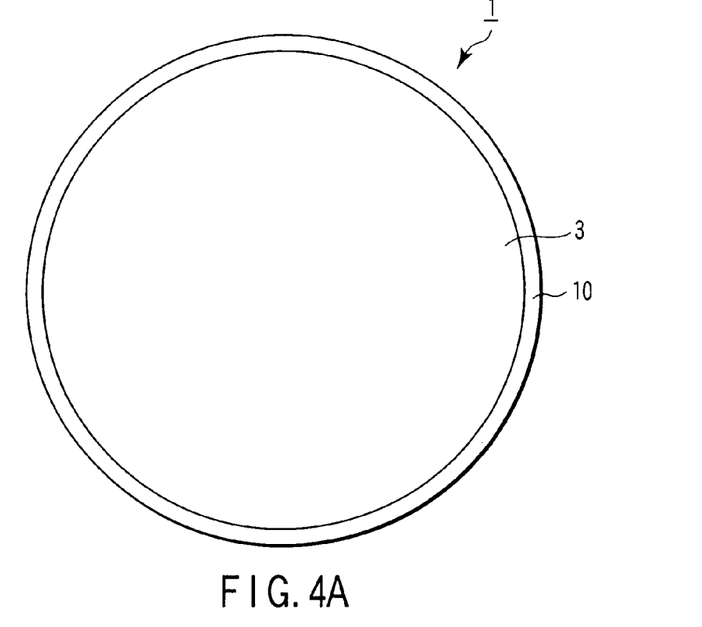
FIGS. 4A and 4B are views showing a stage having a side surface protection cover made by plating according to another embodiment of the present invention.
Figure 4B:
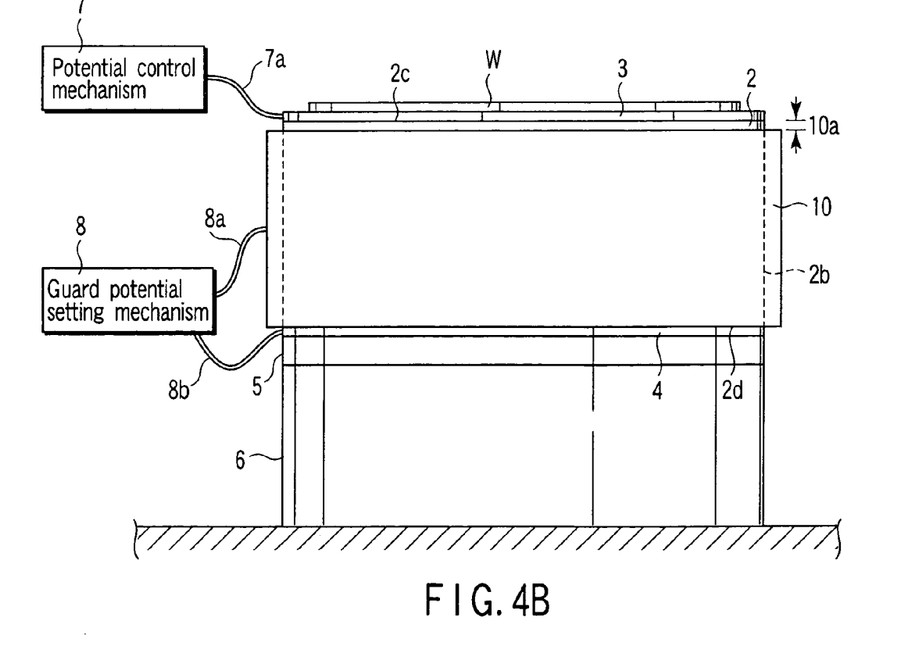

As shown in FIGS. 4A and 4B, a conductive side surface protection cover layer 10 can be formed by plating a side surface 2b of a stage main body 2.

Referring to FIG. 4B, a gap 10a is preferably formed between an upper electrode 3 and the side surface protection cover layer 10 which is formed by plating. Regarding the gap, as shown in FIG. 2B, the gap 3a may be formed by decreasing the diameter of the upper electrode 3. Either gap can be set to 1 mm to 2 mm.

Figure 5:
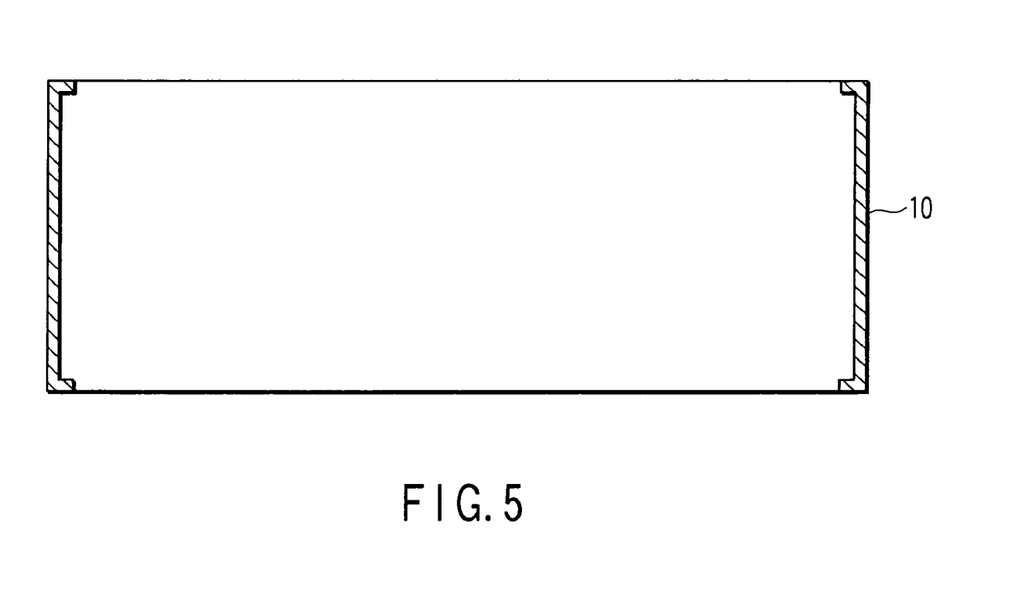
FIG. 5 is a view showing a side surface protection cover having a structure with a U-shaped section according to another embodiment of the present invention.

As shown in FIG. 5, the side surface protection cover layer can have a structure with a U-shaped section.

According to this embodiment, the side surface protection cover layer is arranged on the side surface of the stage main body. Thus, an ionic material such as dust or dirt is prevented from attaching to the side surface of the stage main body.

According to another embodiment, at least the surface of the side surface protection cover layer is rendered conductive, and the conductive surface is connected to the guard potential setting mechanism. Thus, the influence that the small current causes on the original process (e.g., testing) due to dust, humidity, or the like can be decreased.

According to a further embodiment, as a structure for attaching the side surface protection cover layer to the stage main body, a detachable attaching structure may be employed, which facilitates the maintenance operation for the plate-structure side surface protection cover layer.

According to another embodiment, the side surface protection cover layer is formed by a plating process, or is made of a conductive plastic material, thus facilitating the manufacture.

According to still another embodiment, the conductive side surface protection cover layer and upper electrode are separate from each other, or an insulating layer is arranged between them. Then, flow of the current between the side surface protection cover layer and upper electrode can be prevented.

According to still another embodiment, a mechanism that prevents the side surface protection cover layer from dropping is employed. Thus, the side surface protection cover layer can be attached to the side surface of the stage main body stably.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stage for placing a target object thereon, comprising:
   a stage main body having an upper surface, a lower surface, and a side surface, the main body being made of an electrical insulating material;
   a side surface protection cover layer arranged on the side surface of the stage main body, the side surface protection cover layer serving to isolate at least part of the side surface of the stage main body from an ambient atmosphere of the main body and being in contact with the side surface of the stage main body, wherein at least a surface of the side surface protection cover layer is conductive; and
   a guard potential setting mechanism that controls a potential of the conductive surface of the side surface protection cover layer.

2. A stage according to claim 1, further comprising:
   an upper electrode arranged on the upper surface of the stage main body; and
   a lower electrode arranged on the lower surface of the stage main body,
   wherein the guard potential setting mechanism further controls a potential of the lower electrode.

3. A stage according to claim 2, and further comprising a potential control mechanism which controls a potential of the upper electrode.

4. A stage according to claim 1, wherein the side surface protection cover layer has a plate-like structure.

5. A stage according to claim 1, wherein the side surface protection cover layer has a structure with a U-shaped section.

6. A stage according to claim 1, wherein the side surface protection cover layer is formed by a plating process.

7. A stage according to claim 1, wherein the side surface protection cover layer having at least the conductive surface is made of a conductive plastic material.

8. A stage according to claim 2, wherein the side surface protection cover layer is separate from the upper electrode so as not to come into electrical contact with the upper electrode.

9. A stage for placing a target object thereon, comprising:
   a stage main body having an upper surface, a lower surface, and a side surface, the main body being made of an electrical insulating material; and
   a side surface protection cover layer arranged on the side surface of the stage main body, the side surface protection cover layer serving to isolate at least part of the side surface of the stage main body from an ambient atmosphere of the main body,
   wherein at least a surface of the side surface protection cover layer is conductive, and
   further comprising an insulating layer arranged between the stage main body and side surface protection cover layer.

10. A stage according to claim 1, wherein the side surface protection cover layer having the plate-like structure is detachably attached to the side surface of the stage main body.

11. A stage according to claim 1, wherein the side surface of the stage main body includes a dropping preventive mechanism which prevents the side surface protection cover from dropping.

12. A stage for placing a target object thereon, comprising:
    a stage main body having an upper surface, a lower surface, and a side surface, the main body being made of an electrical insulating material; and
    a side surface protection cover layer arranged on the side surface of the stage main body, the side surface protection cover layer serving to isolate at least part of the side surface of the stage main body from an ambient atmosphere of the main body,
    wherein at least a surface of the side surface protection cover layer is conductive, and
    wherein the side surface protection cover layer having at least the conductive surface is made of a conductive plastic material.

* * * * *